United States Patent
Tanigawa et al.

(10) Patent No.: US 10,388,994 B2
(45) Date of Patent: Aug. 20, 2019

(54) BATTERY STATE DETECTION APPARATUS AND METHOD FOR MANUFACTURING SAME

(71) Applicants: FURUKAWA ELECTRIC CO., LTD., Tokyo (JP); FURUKAWA AUTOMOTIVE SYSTEMS INC., Shiga (JP)

(72) Inventors: Tomoaki Tanigawa, Shiga (JP); Fumitaka Iwasaki, Shiga (JP); Norihito Motosugi, Shiga (JP); Yoshikazu Tanaka, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 94 days.

(21) Appl. No.: 14/902,340

(22) PCT Filed: Jun. 30, 2014

(86) PCT No.: PCT/JP2014/003456
§ 371 (c)(1),
(2) Date: Dec. 31, 2015

(87) PCT Pub. No.: WO2015/001781
PCT Pub. Date: Jan. 8, 2015

(65) Prior Publication Data
US 2016/0141731 A1 May 19, 2016

(30) Foreign Application Priority Data
Jul. 3, 2013 (JP) .................................. 2013-140098

(51) Int. Cl.
*H01M 10/48* (2006.01)
*G01R 31/364* (2019.01)
(Continued)

(52) U.S. Cl.
CPC ............ *H01M 10/48* (2013.01); *G01R 1/203* (2013.01); *G01R 31/364* (2019.01);
(Continued)

(58) Field of Classification Search
CPC .................................................. G01R 31/3696
See application file for complete search history.

(56) References Cited

U.S. PATENT DOCUMENTS

| | | | | |
|---|---|---|---|---|
| 5,619,770 A * | 4/1997 | Bell | ...................... | A47L 11/164 15/230 |
| 7,671,755 B2 * | 3/2010 | Dreiskemper | ......... | G01R 1/203 340/425.5 |

(Continued)

FOREIGN PATENT DOCUMENTS

| | | | | |
|---|---|---|---|---|
| DE | 102004055847 A1 * | 6/2006 | ............. | G01R 1/203 |
| DE | 102004055849 A1 * | 6/2006 | ......... | G01R 31/3696 |

(Continued)

OTHER PUBLICATIONS

Extended European Search Report dated Dec. 19, 2016 for European Application No. 14819532.4, 7 pages.

(Continued)

*Primary Examiner* — Robert J Grant
*Assistant Examiner* — Tynese V McDaniel
(74) *Attorney, Agent, or Firm* — Amin, Turocy & Watson, LLP

(57) ABSTRACT

A battery state detection device (1) includes a shunt resistor (7) and a battery post terminal (4). The shunt resistor (7) includes a second conductor part (12) in the shape of a flat plate. The battery post terminal (4) includes a battery post connecting part (20) for connection to a battery post, and a shunt resistor connecting part (22) for connection to the second conductor part (12) of the shunt resistor (7). The shunt resistor connecting part (22) is in the shape of a flat (Continued)

plate. The second conductor part (12) of the shunt resistor (7) and the shunt resistor connecting part (22) of the battery post terminal (4) are connected to each other by welding.

9 Claims, 8 Drawing Sheets

(51) Int. Cl.
    *H01M 2/20*     (2006.01)
    *H01M 2/30*     (2006.01)
    *G01R 1/20*     (2006.01)
    *H01R 11/28*     (2006.01)
    *H01R 13/66*     (2006.01)
    *H01M 10/42*     (2006.01)

(52) U.S. Cl.
    CPC ........... *H01M 2/206* (2013.01); *H01M 2/305* (2013.01); *H01R 11/287* (2013.01); *H01R 13/6616* (2013.01); *H01R 13/6658* (2013.01); *H01M 10/425* (2013.01)

(56) References Cited

U.S. PATENT DOCUMENTS

| | | | |
|---|---|---|---|
| 8,147,280 B2 | 4/2012 | Fernandez et al. | |
| 8,305,034 B2* | 11/2012 | Rubio | G01R 1/203 320/104 |
| 2002/0043880 A1* | 4/2002 | Suzuki | H02K 7/06 310/12.14 |
| 2006/0216800 A1 | 9/2006 | Ishihara et al. | |
| 2008/0018120 A1* | 1/2008 | Bailey | E05B 85/12 292/336.3 |
| 2008/0030208 A1* | 2/2008 | Aratani | G01R 1/203 324/713 |
| 2008/0194152 A1* | 8/2008 | Roset | H01R 11/281 439/754 |
| 2008/0309469 A1* | 12/2008 | Ferre Fabregas | G01R 1/203 340/438 |
| 2009/0184683 A1* | 7/2009 | Abe | H02J 7/1453 320/134 |
| 2009/0243622 A1* | 10/2009 | Schimmel | H01R 11/287 324/437 |
| 2010/0019733 A1 | 1/2010 | Rubio | |
| 2010/0066351 A1* | 3/2010 | Condamin | G01R 1/203 324/126 |
| 2011/0062945 A1 | 3/2011 | Condamin et al. | |
| 2014/0152313 A1* | 6/2014 | Hetzler | G01R 31/3624 324/426 |
| 2014/0311847 A1* | 10/2014 | Hillaert | A45C 5/14 190/18 A |

FOREIGN PATENT DOCUMENTS

| | | |
|---|---|---|
| JP | 2002122203 A | 4/2002 |
| JP | 2008524568 A | 7/2008 |
| JP | 2011210610 A | 10/2011 |
| JP | 2011249307 A | 12/2011 |
| JP | 2012215452 A | 11/2012 |
| WO | 2006067300 A1 | 6/2006 |

OTHER PUBLICATIONS

International Search Report dated Aug. 19, 2014 for PCT Application No. PCT/JP2014/003456, 4 pages.

* cited by examiner

BATTERY STATE DETECTION APPARATUS AND METHOD FOR MANUFACTURING SAME

CROSS-REFERENCE TO RELATED APPLICATIONS

This application is a U.S. National Stage patent application filing under 35 USC § 371 of international Patent Cooperation Treaty (PCT) Application No. PCT/JP2014/003456, filed on Jun. 30, 2014, and entitled "BATTERY STATE DETECTION APPARATUS AND METHOD FOR MANUFACTURING SAME," which claims priority to Japanese Patent Application No. 2013-140098, filed on Jul. 3, 2013, both of which applications are hereby incorporated by reference herein in their entireties.

TECHNICAL FIELD

The present invention relates to a battery state detection device, and mainly to a structure that connects a battery post terminal and a shunt resistor to each other.

BACKGROUND ART

Conventionally known is a battery state detection device (battery sensor) that detects the state of a battery. Such battery state detection devices are disclosed in, for example, Patent Documents 1 and 2.

The battery state detection device of this type includes a battery post terminal for connection to a battery post, a shunt resistor, and a circuit board. The shunt resistor is electrically connected to the battery post terminal. The circuit board is configured to measure a current having flowed through the battery post terminal by measuring a potential difference across the shunt resistor.

The conventional battery state detection device is configured such that the shunt resistor and the battery post terminal are electrically and mechanically connected to each other by being fastened to each other with a bolt and a nut.

PRIOR-ART DOCUMENTS

Patent Documents

Patent Document 1: Japanese Patent Application Laid-Open No. 2011-210610
Patent Document 2: Japanese Patent Application Laid-Open No. 2012-215452

SUMMARY OF THE INVENTION

Problems to be Solved by the Invention

In the conventional battery state detection device, the bolt and nut are used to connect the battery post terminal and the shunt resistor to each other. This causes a size increase of the battery state detection device in accordance with the size of the bolt and nut. Particularly when a casing for housing the shunt resistor, the circuit board, and the like, is provided; the casing is configured to house the bolt and nut from the viewpoint of waterproofness. This inevitably increases the size of the casing in accordance to the size of the bolt and nut. Downsizing of the casing is difficult.

In assembling the conventional battery state detection device, an operation of tightening the bolt and nut is required. An assembler firstly picks up a bolt, and appropriately inserts the bolt through reception holes of the battery post terminal and the shunt resistor. Then, the assembler picks up a nut, and makes the bolt received through the nut. Then, the assembler tightens the bolt and nut by using a tool such as a wrench. Such a complicated operation is required to connect the battery post terminal and the shunt resistor to each other. This presents a problem that manufacturing the battery state detection device takes time.

In the conventional configuration described above, the reception holes for receiving the bolt need to be formed in the battery post terminal and the shunt resistor. Moreover, as mentioned above, when the casing for housing the shunt resistor and the circuit board is provided, the casing is configured to house the bolt. Thus, the shapes of the shunt resistor and the casing are limited by the position where the bolt is inserted. Therefore, for example, a change of the design of the battery post terminal, which leads to a change of the position where the bolt is inserted, may result in the need to change the designs of the shunt resistor and the casing, too. This is why flexibly changing the design of the battery post terminal has been difficult and dynamically adapting to a variety of types of battery post terminals has been impossible.

The present invention has been made in view of the circumstances described above, and a primary object of the present invention is to provide a configuration of a battery state detection device capable of downsizing and simplification of a manufacturing process while allowing a flexible design change.

Means for Solving the Problems and Effects Thereof

Problems to be solved by the present invention are as described above, and next, means for solving the problems and effects thereof will be described.

In an aspect of the present invention, the following battery state detection device is provided. The battery state detection device includes a shunt resistor and a battery post terminal. The shunt resistor includes a conductor part having, at least partially, a flat shape. The battery post terminal includes a battery post connecting part that is to be connected to a battery post, and a shunt resistor connecting part that is to be connected to the conductor part of the shunt resistor. The shunt resistor connecting part has a flat shape. The conductor part of the shunt resistor and the shunt resistor connecting part of the battery post terminal are connected to each other by welding.

Since connection between the shunt resistor and the battery post terminal is made by welding, the bolt and nut which have been conventionally used for the connection of them are not required. As a result, the battery state detection device can be downsized as compared with the conventional configuration. Additionally, the connection made by welding is less complicated and can be completed in a shorter time than the operation of tightening the bolt and nut. Accordingly, the above-described configuration can shorten a time required for manufacturing the battery state detection device. Moreover, connecting the shunt resistor and the battery post terminal to each other by welding is enabled as long as they have flat portions. Accordingly, the above-described configuration eliminates the need to provide holes for receiving the bolt in the shunt resistor and the casing. Therefore, when, for example, a change of the shape of the battery post terminal occurs, there is no need to change the designs of the shunt resistor and the casing. This makes it possible to dynamically adapt to a variety of types of battery post structures.

Preferably, the battery state detection device is configured as follows. The battery state detection device includes a circuit board that detects a current having flowed through the shunt resistor, and a casing that houses the circuit board. The casing is molded while the shunt resistor and the battery post terminal connected to each other by the welding are at least partially inserted in the casing. The battery post terminal includes an exposure boundary portion having a flat shape. The exposure boundary portion is a portion at the boundary between a portion of the battery post terminal inserted in the casing and a portion of the battery post terminal exposed to the outside of the casing.

Since the casing is formed with the battery post terminal and the shunt resistor inserted therein, the waterproofness of the casing can be improved. Moreover, since the exposure boundary portion of the battery post terminal has a flat shape, leakage of a resin during the insert-molding can be avoided. As a result, the waterproofness of the casing can be improved.

In the battery state detection device, it is preferable that portions of the shunt resistor and the battery post terminal inserted in the casing are provided with bevels.

In a case where a shunt resistor made of a metal and a terminal made of a metal are inserted in a casing made of a resin, a stress may occur because of a difference in the coefficient of thermal expansion. In this point, beveling the shunt resistor and the battery post terminal to eliminate angulated portions can prevent a stress from concentrating to a particular region of the casing. Accordingly, the durability and reliability of the casing can be improved.

Preferably, the battery state detection device is configured as follows. The shunt resistor includes a harness connecting part that is to be connected to a harness. The battery post terminal is provided with a boss portion that extends along an imaginary line connecting the battery post connecting part to the harness connecting part.

Providing the boss portion makes the battery post terminal less likely to be twisted when a force is applied to the harness connecting part.

In the battery state detection device, it is acceptable that the battery post terminal includes a bent portion and a reinforcement wall. The bent portion is a cranked portion provided between the shunt resistor connecting part and the battery post connecting part. The reinforcement wall is connected to a lateral end surface of the bent portion.

Such a configuration including the bent portion provided in the battery post terminal and the reinforcement wall connected to the lateral end surface of the bent portion can ensure a strength of the battery post terminal.

EMBODIMENT FOR CARRYING OUT THE INVENTION

Figure 1:
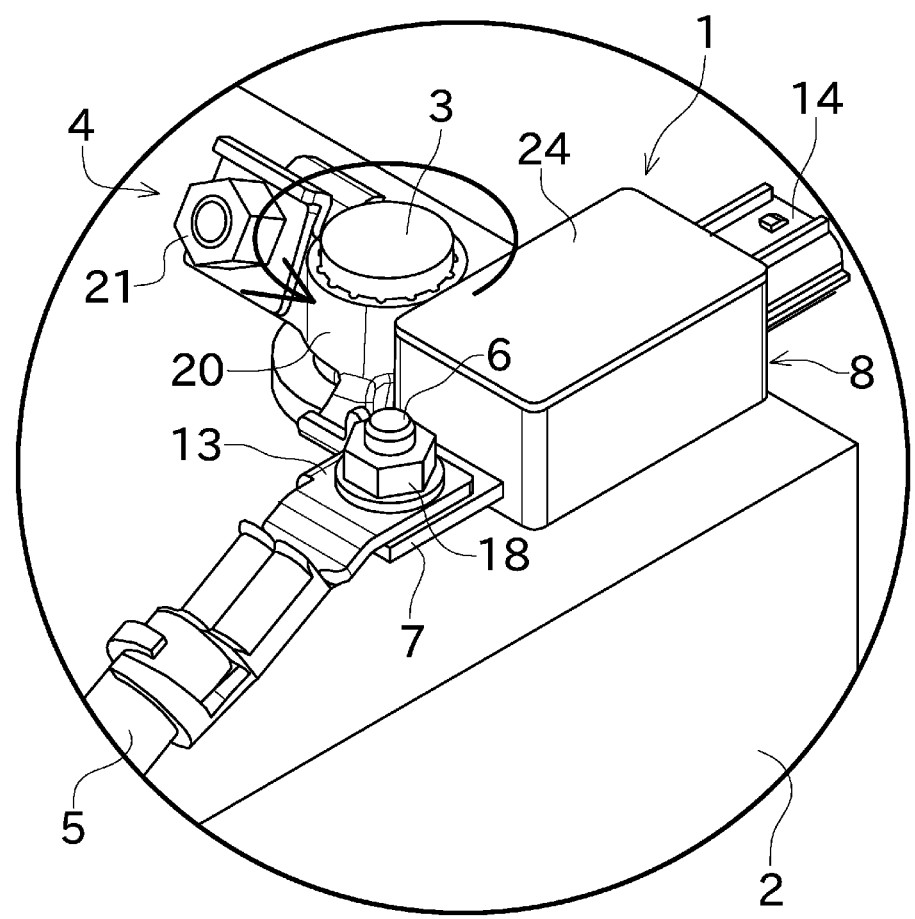
FIG. 1 A perspective view showing a battery state detection device in use according to an embodiment of the present invention.

An embodiment of the present invention will be described with reference to the drawings. As shown in FIG. 1, a battery state detection device 1 of this embodiment includes a battery post terminal 4 for connection to a battery post 3 of a battery 2 that is provided in an automobile or the like, a harness connecting part 6 for connection to a harness 5 that is connected to a load (not shown), and a casing 8.

Figure 4:
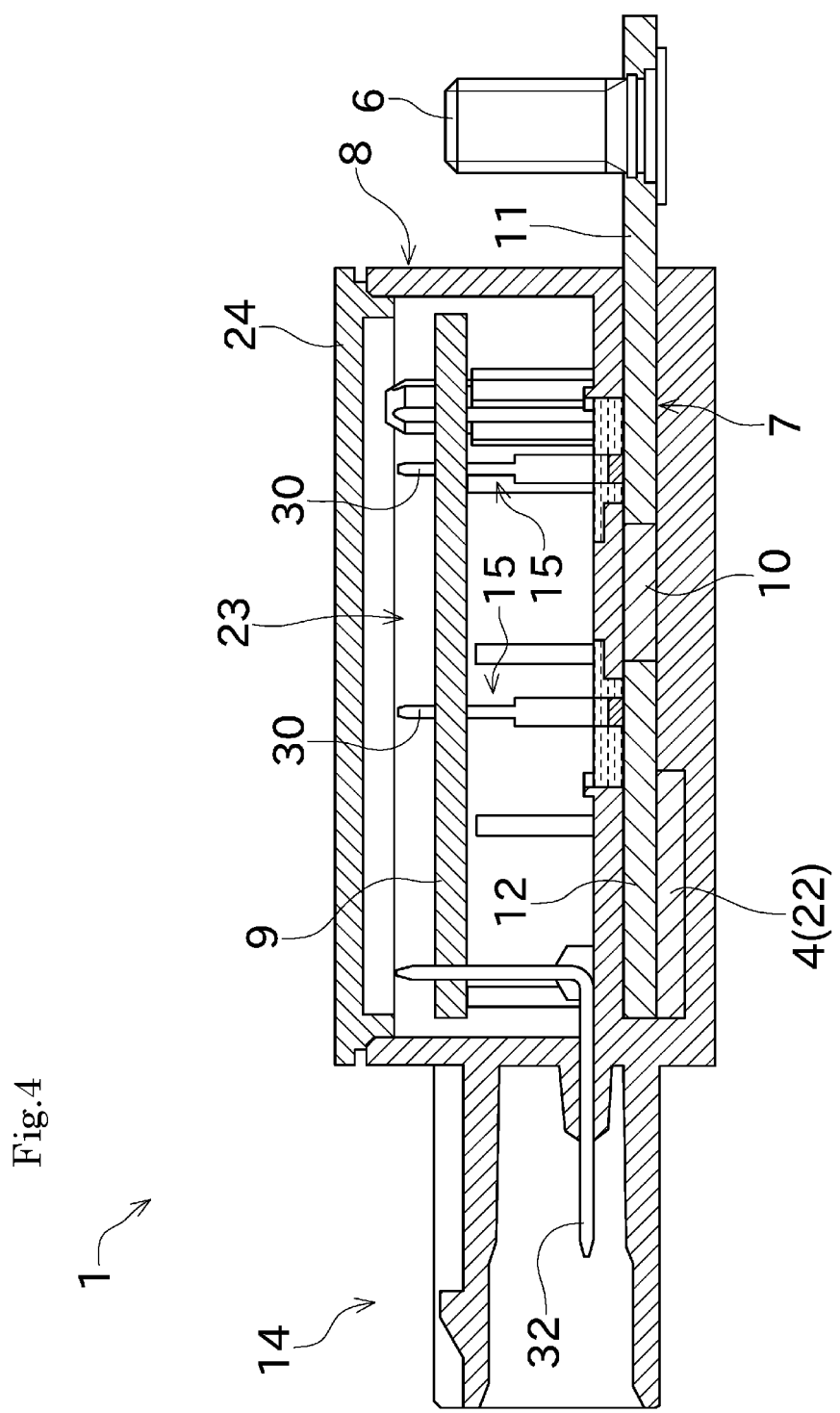
FIG. 4 A front cross-sectional view showing the battery state detection device.

The casing 8 is made of a resin, and in the shape of a box. As shown in FIG. 4, a storage space 23 for storing a circuit board 9 and the like is formed in the casing 8. The casing 8 includes a lid part 24 that closes an opening of the storage space 23. As shown in FIG. 4, the casing 8 is molded with a part of a shunt resistor 7 and a part of the battery post terminal 4 inserted (details will be given later).

Figure 2:
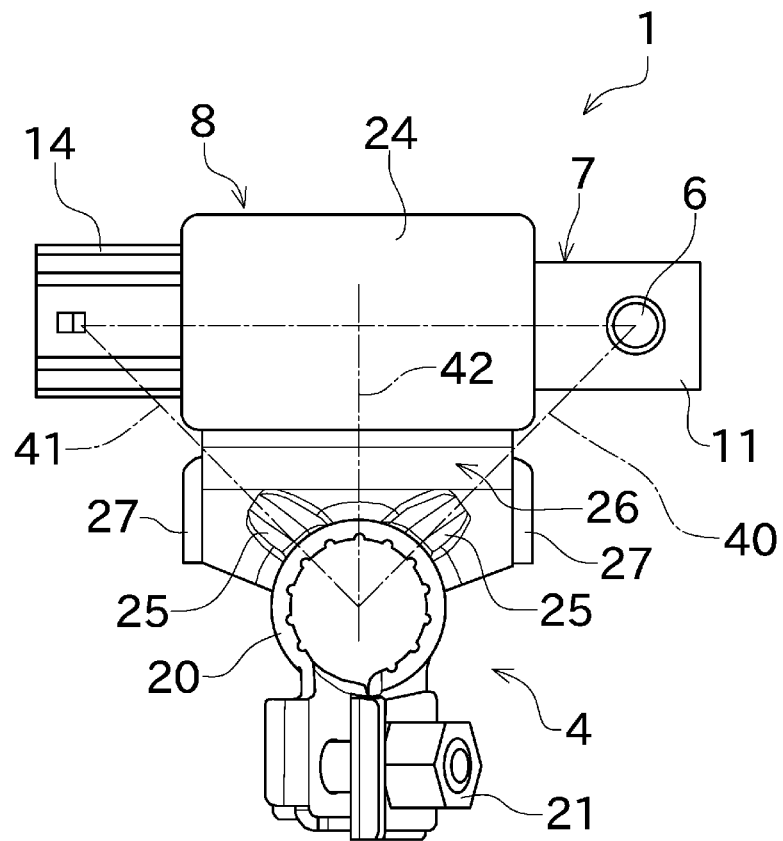
FIG. 2 A plan view of the battery state detection device.

The battery post terminal 4 is formed of a metal plate through a stamping or bending process. Referring to FIGS. 1 and 2, the battery post terminal 4 includes a battery post connecting part 20 for connection to the battery post 3 of the battery 2. As shown in FIG. 2, etc., the battery post connecting part 20 is arranged outside the casing 8. The battery post connecting part 20 has a substantially tube-like shape. Under a state where this tube-like portion receives the battery post 3 therein, a tightening bolt 21 is tightened, so that the tube-like portion bites into a peripheral surface of the battery post 3. As a result, the battery post connecting part 20 is (electrically and mechanically) connected to the battery post 3.

Figure 3:
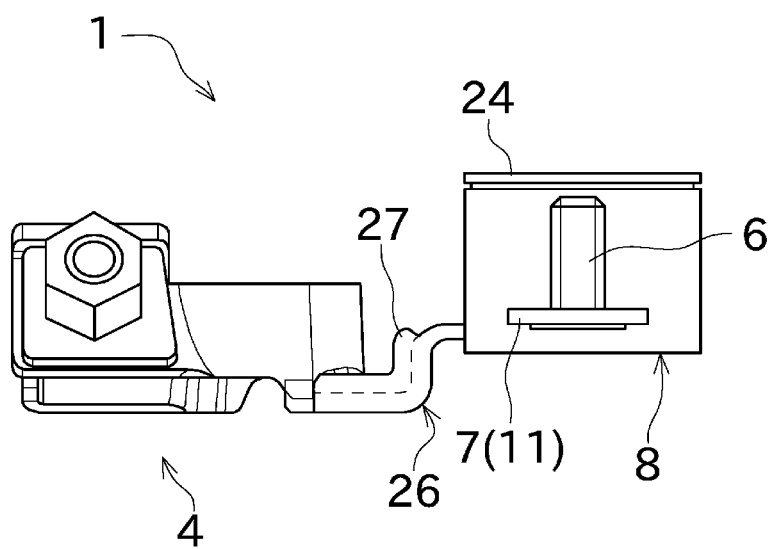
FIG. 3 A side view of the battery state detection device.

As shown in FIG. 3, etc., the harness connecting part 6 is configured as a bolt (stud bolt). The harness 5 has, in its end portion, a terminal 13 (FIG. 1). As shown in FIG. 1, the harness connecting part 6 is received through the terminal 13, and additionally a nut 18 is tightened to the harness connecting part 6, which results in (electrical and mechanical) connection of the harness 5 to the harness connecting part 6.

Figure 5:
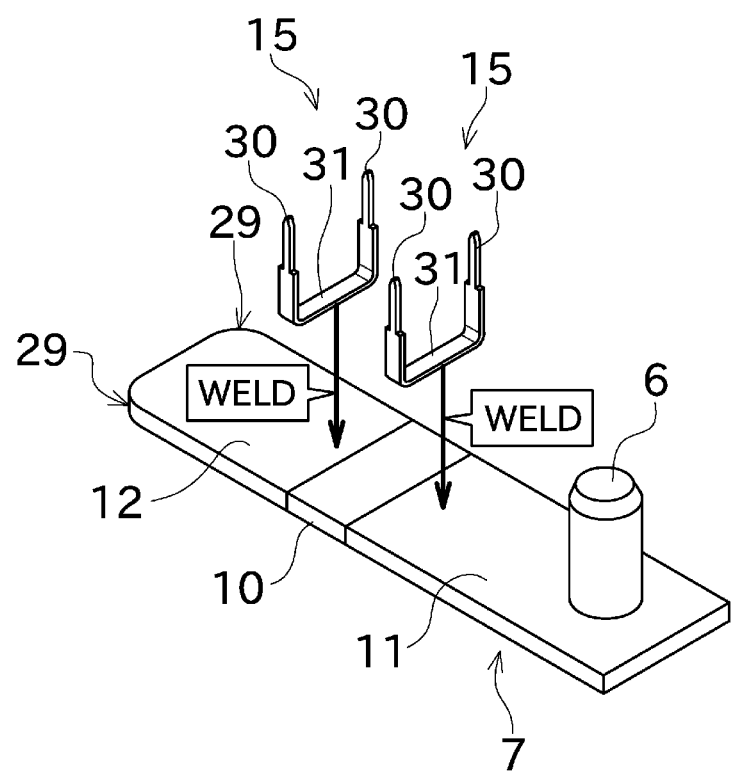
FIG. 5 A perspective view showing a situation where board connection terminals are mounted to a shunt resistor.

As shown in FIGS. 4 and 5, the shunt resistor 7 is configured such that a resistor element 10 (e.g., Manganin) whose resistance value is known is arranged between a first conductor part 11 and a second conductor part 12. As shown in FIG. 5, each of the first conductor part 11, the second conductor part 12, and the resistor element 10 is in the shape of a flat plate. Thus, the shunt resistor 7 as a whole is in the shape of a flat plate. As shown in FIG. 5, etc., the shunt resistor 7 has an elongated shape elongated in a direction of arrangement of the first conductor part 11, the resistor element 10, and the second conductor part 12. Herein, the direction of arrangement of the first conductor part 11, the resistor element 10, and the second conductor part 12 will be called a longitudinal direction of the shunt resistor 7.

A portion of the first conductor part 11, the second conductor part 12, and the resistor element 10 are arranged within the casing 8 (through the insert-molding). Referring to FIG. 4, the first conductor part 11 is arranged so as to partially protrude out of the casing 8. The harness connecting part 6 is provided on this protruding portion.

The battery post terminal 4 is connected to the second conductor part 12 of the shunt resistor 7. A specific configuration of connection between the shunt resistor 7 and the battery post terminal 4 will be described later.

As shown in FIGS. 4 and 5, each of the first conductor part 11 and the second conductor part 12 of the shunt resistor 7 is provided with one board connection terminal 15. As shown in FIG. 5, the board connection terminal 15 of this embodiment is formed of a metal member in the shape of an elongated plate being bent into substantially U-like shape (or C-like shape). The board connection terminal 15 has two connecting parts 30 whose proximal end portions are connected via a middle portion 31. More specifically, the middle portion 31 has a substantially linear shape. The two connecting parts 30, whose proximal ends are located at opposite ends of the middle portion 31, linearly protrude in a direction substantially perpendicular to a longitudinal direction of the middle portion 31. The two connecting parts 30 of the board connection terminal 15 are substantially in parallel to each other. As shown in FIG. 4, each of the connecting parts 30 is appropriately connected to an electronic circuit mounted on the circuit board 9. Thus, the shunt resistor 7 is electrically connected to the electronic circuit provided on the circuit board 9.

The circuit board 9 is configured to apply pulse discharge via the board connection terminals 15 and to detect, for example, the intensity of a current having flowed through the resistor element 10 via the board connection terminals 15. The casing 8 includes a connector 14 (see FIGS. 1 and 4) that outputs a result of the detection. The circuit board 9 is connected to an output terminal 32 (FIG. 4) provided in the connector 14, and configured to output a result of the detection through the output terminal 32. Another external device (for example, an engine control unit (ECU) of an automobile) connected to the connector 14 is able to determine the battery state based on the result of the detection outputted from the connector 14. Since a method for determining the battery state based on a detection result obtained through pulse discharge or the like is known, a detailed description thereof is omitted.

Next, a characteristic configuration of this embodiment will be described.

In the conventional battery state detection device, as mentioned above, a bolt and a nut are used to connect the battery post terminal 4 and the shunt resistor 7 to each other.

In this respect, one of the features of the battery state detection device 1 of this embodiment is that the battery post terminal 4 and the shunt resistor 7 are connected to each other by welding. A more specific description will be given below.

Figure 6:
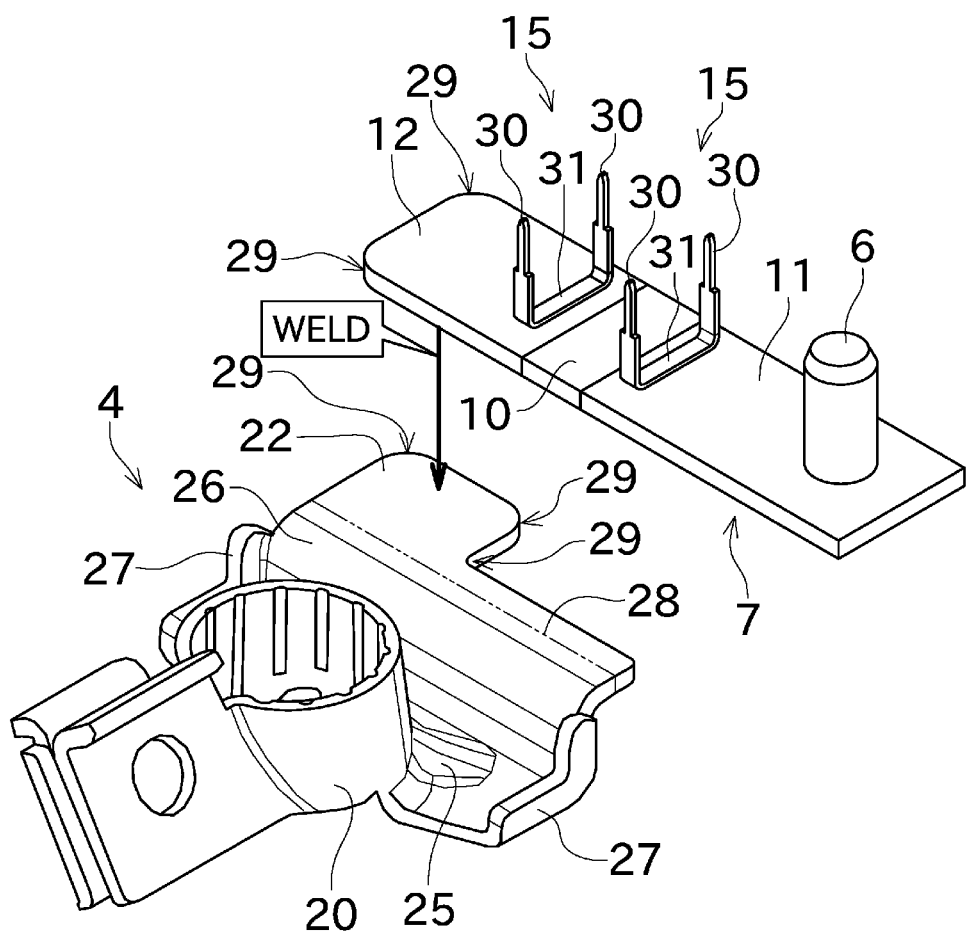
FIG. 6 A perspective view showing a situation where the shunt resistor is connected to a battery post terminal.
Figure 7:
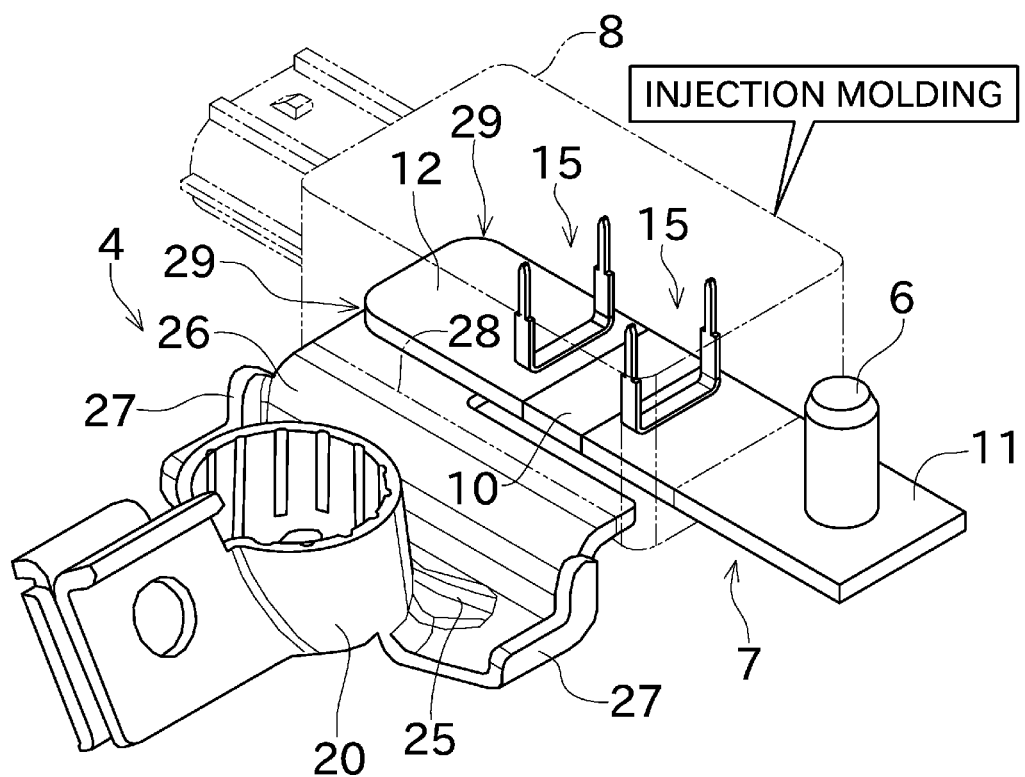
FIG. 7 A perspective view illustrating molding of a casing.

As shown in FIG. 6, the battery post terminal 4 of this embodiment includes a shunt resistor connecting part 22 for connection to the second conductor part 12 of the shunt resistor 7. The shunt resistor connecting part 22 has its upper surface flat, as shown in FIG. 6. As mentioned above, the second conductor part 12 of the shunt resistor 7 is in the shape of a flat plate. Thus, a lower surface of the second conductor part 12 is flat. The flat second conductor part 12 and the flat shunt resistor connecting part 22 are arranged one on the other and welded by an appropriate technique, and thereby they can be connected electrically and mechanically.

The above-described configuration eliminates the need of the bolt and nut which have been required to connect the battery post terminal 4 and the shunt resistor 7 to each other in the conventional battery state detection device. As a result, a connection portion where the battery post terminal 4 and the shunt resistor 7 are connected to each other can be made small with respect to its thickness direction as compared with the conventional configuration. Moreover, the connecting portion, which is made through welding, has a sufficient strength and a high reliability. Preferably, the shunt resistor connecting part 22 has a flatness of 0.5 mm or less, which enables a mechanical strength of a welded portion to be maintained against impacts, vibrations, and the like.

Additionally, the conventional battery state detection device requires the operation of tightening the bolt and nut in order to connect the battery post terminal 4 and the shunt resistor 7 to each other. In this embodiment, on the other hand, they are connected by welding. This eliminates the need of the operation of tightening a bolt and a nut. The welding operation itself is uncomplicated and does not take much time. Accordingly, the battery state detection device 1 can be manufactured for a shortened time.

Moreover, the conventional battery state detection device adopts the bolt and nut for connection between the battery post terminal 4 and the shunt resistor 7, which makes it necessary that reception holes for receiving the bolt are formed in the battery post terminal 4, the shunt resistor 7, and the like. Therefore, for example, a change of the design of the battery post terminal 4, which leads to a change of the position where the bolt is inserted, may result in the need to change the design of the shunt resistor 7, too.

In this point, this embodiment adopts welding for connection between the battery post terminal 4 and the shunt resistor 7. Therefore, holes for receiving a bolt for connecting them, and the like, are not required. The battery post terminal 4 can be connected to the shunt resistor 7 by welding, as long as the battery post terminal 4 includes the flat-shaped shunt resistor connecting part 22. When, for example, a change of the design of the battery post terminal 4 occurs, the change does not affect the shunt resistor 7. Accordingly, design of the battery state detection device 1 can be changed flexibly.

In this embodiment, the casing 8 is injection-molded while a part (the shunt resistor connecting part 22) of the battery post terminal 4 and a part (the second conductor part 12, the resistor element 10, and a portion of the first conductor part 11) of the shunt resistor 7 are inserted.

Inserting the shunt resistor 7 and the battery post terminal 4 while molding the casing 8 provides improved adhesion of the casing 8 to the shunt resistor 7 and the battery post terminal 4. Accordingly, a situation where a gap between the casing 8 and the shunt resistor 7 or between the casing 8 and the battery post terminal 4 serves as a path of entry of water, is less likely to occur. As a result, waterproofness of the casing 8 can be further improved.

A boundary between a portion of the battery post terminal 4 exposed to the outside of the casing 8 and a portion of the battery post terminal 4 inserted in the casing 8 will be called an exposure boundary portion 28. As shown in FIG. 6, the exposure boundary portion 28 is positioned between the battery post connecting part 20 and the shunt resistor connecting part 22.

If the exposure boundary portion 28 is not flat (having unevenness), leakage of a resin is likely to occur during formation of the casing 8 with the battery post terminal 4 inserted. In this embodiment, however, the battery post terminal 4 is configured such that the exposure boundary portion 28 has a flat plate shape. Since the exposure boundary portion 28 is flat, leakage of a resin during formation of the casing 8 with the battery post terminal 4 inserted can be avoided. As a result, the waterproofness of the casing 8 can be improved.

In this embodiment, as shown in FIG. 6, the exposure boundary portion 28 has a larger width than that of the shunt resistor connecting part 22. To be specific, the battery post terminal 4 is configured such that the width is increased in a boundary between its portion exposed to the outside of the casing 8 and its portion inserted in the casing 8. Such a configuration ensures a strength because a large area can be ensured as a contact area over which the battery post terminal 4 and the casing 8 are in contact.

The battery post terminal 4 is arranged such that its portion located at the battery post connecting part 20 side relative to the exposure boundary portion 28 is exposed to the outside of the casing 8. Thus, the battery post connecting part 20 is exposed to the outside of the casing 8 (not inserted in the casing 8). Therefore, when, for example, a change of the shape of the battery post connecting part 20 occurs, the change does not affect the design of the casing 8. Accordingly, the battery state detection device of this embodiment enables the shape of the battery post connecting part 20 to be changed flexibly.

For example, a plurality of battery post terminals 4 are prepared whose battery post connecting parts 20 have different shapes each corresponding to each of different vehicle types. The plurality of battery post terminals 4 have in common the shape of the portion inserted in the casing 8 (the portion located at the shunt resistor connecting part 22 side relative to the exposure boundary portion 28). Thus, the design of the casing 8 need not be changed whichever of the battery post terminals 4 is adopted. Accordingly, battery state detection devices having the battery post connecting parts 20 with different shapes each corresponding to each vehicle type are provided at a low cost.

Figure 8:
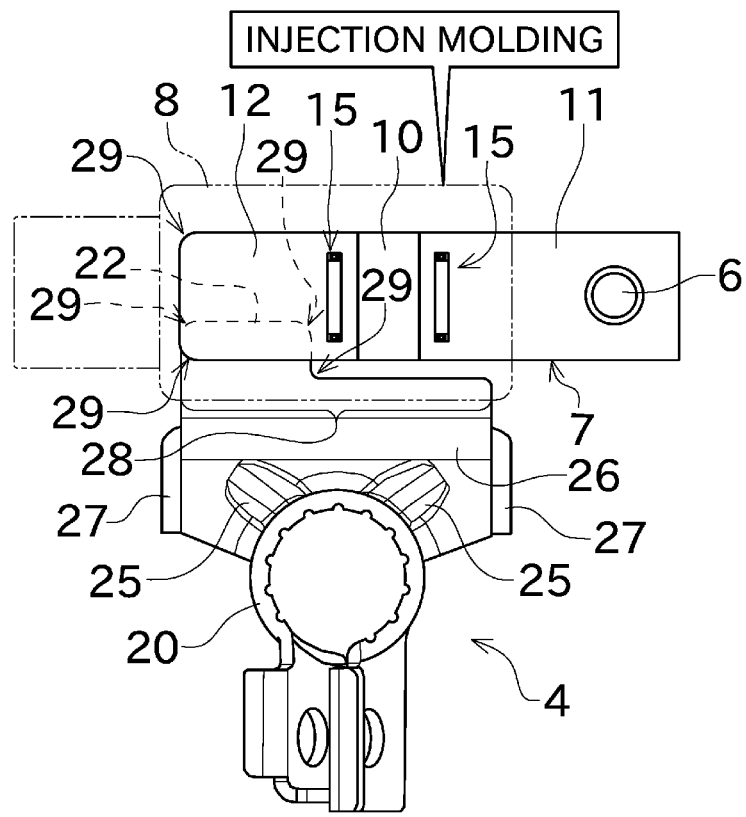
FIG. 8 A plan view illustrating molding of the casing.
Figure 9:
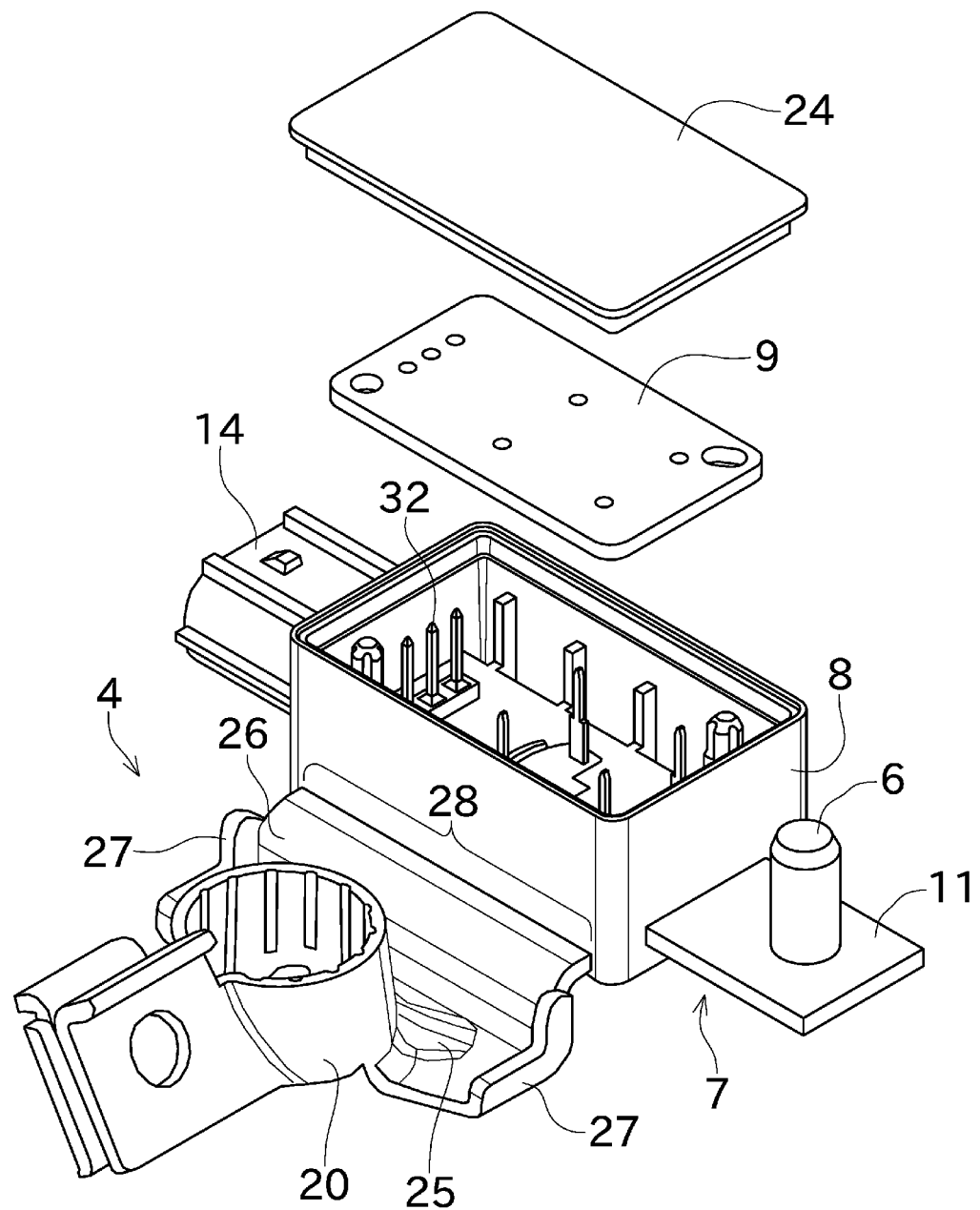
FIG. 9 A perspective view showing a situation where a circuit board and the like are housed in the casing.

In this embodiment, as shown in FIGS. 6, and 8, etc., the shunt resistor 7 and the battery post terminal 4 are provided with bevels 29. In this embodiment, the shunt resistor 7 and the battery post terminal 4 are inserted in the casing 8, but a resin (the casing 8) and a metal (the shunt resistor 7 and the battery post terminal 4) have different coefficients of linear expansion, and therefore a stress is generated in a joint between them at a time of thermal expansion.

This is why the portions of the shunt resistor 7 and the battery post terminal 4 inserted in the casing 8 are beveled in advance (bevels 29) as described above, to make angulated portions as small as possible. This can prevent the stress generated due to the difference in coefficient of linear expansion from concentrating to a particular region of the casing 8. Accordingly, the durability of the casing 8 can be improved, and the battery state detection device 1 having a high reliability can be provided.

In this embodiment, the board connection terminal 15 is mounted to the shunt resistor 7 by welding. More specifically, as shown in FIG. 5, the middle portion 31 of the board connection terminal 15 is welded to the shunt resistor 7, and thereby the board connection terminal 15 is (electrically and mechanically) connected to the shunt resistor 7.

In the conventional battery state detection device, the board connection terminal 15 is mounted to the shunt resistor 7 with a mounting screw. To mount the board connection terminal 15, an operation of screwing the mounting screw is required. Therefore, it takes time for assembling. In this embodiment, welding is adopted to mount the board connection terminal 15 to the shunt resistor 7, which eliminates the conventional need for the operation of screwing the mounting screw. As a result, the battery state detection device can be assembled for a further shortened time.

Next, a description will be given of a configuration for ensuring a strength of the battery post terminal 4 in the battery state detection device 1 of this embodiment.

In the battery state detection device 1 of this type, as mentioned above, the harness 5 is connected to the harness connecting part 6 by the nut 18 (FIG. 1) being tightened to the harness connecting part 6. In some case, for example, when an operator applies a force in order to tighten the nut 18, a torque about the battery post 3 is produced in the battery state detection device 1, as indicated by the bold line in FIG. 1. The battery post terminal 4 is required to have a degree of strength that withstands deformation against the torque.

In the battery post terminal 4 of this embodiment, the portion inserted in the casing 8 (the portion at the shunt resistor connecting part 22 side relative to the exposure boundary portion 28) is in the shape of a flat plate. That is, the portion inserted in the casing 8, which is in the shape of a flat plate, is compact with respect to the thickness direction. As a result, the casing 8 itself can be made compact. Such a structure that the whole of the battery post terminal 4 is in the shape of a flat plate is vulnerable to a torsional force, and readily deformed by the torque. Therefore, the battery post terminal 4 of this embodiment includes a boss portion 25 and a bent portion 26, as shown in FIG. 2, etc. The boss portion 25 and the bent portion 26 are provided in a region (region exposed from the casing 8) between the exposure boundary portion 28 and the battery post connecting part 20.

The boss portion 25 is formed so as to protrude toward one side with respect to the thickness direction of the shunt resistor connecting part 22 (the direction perpendicular to the drawing plane of FIG. 2). When seen in the thickness direction of the shunt resistor connecting part 22 (as shown in FIG. 2), the boss portion 25 starts from the battery post connecting part 20 and extends along an imaginary line 40 connecting the battery post connecting part 20 to the harness connecting part 6.

As shown in FIG. 3, the bent portion 26 is a portion of the battery post terminal 4 being cranked. A "fold" line of the bent portion 26 is substantially in parallel to the longitudinal direction of the shunt resistor 7 (the horizontal direction in FIG. 2). Reinforcement walls 27 extending in a direction perpendicular to the fold line are provided. The reinforcement walls 27 are connected to lateral end surfaces of the bent portion 26. The reinforcement walls 27 reinforce a cranked structure of the bent portion 26.

The presence of the boss portion 25 and the bent portion 26 described above makes the battery post terminal 4 resistant to a torsional force, thus ensuring a strength of the battery post terminal 4. Accordingly, even when a torque is applied to the battery post terminal 4 when the nut 18 is tightened, deformation of the battery post terminal 4 can be prevented.

Moreover, as shown in FIG. 2, the battery post terminal 4 of this embodiment includes a boss portion 25 that, when seen in the thickness direction of the shunt resistor connecting part 22, starts from the battery post connecting part 20 and extends along an imaginary line 41 connecting the battery post connecting part 20 to the connector 14. That is, in the battery post terminal 4 of this embodiment, the boss portions 25 are arranged at two positions.

In the battery state detection device 1 of this embodiment, the imaginary line 40 and the imaginary line 41 have almost the same length. The battery post connecting part 20, the harness connecting part 6, and the connector 14 define the vertices of a substantially isosceles triangle. Therefore, the battery post connecting part 20, the harness connecting part 6, and the connector 14 are arranged in a balanced distribution, with the two boss portions 25 arranged at a proper interval.

In this embodiment, as shown in FIG. 2, the reinforcement walls 27 are arranged on opposite side portions of the bent portion 26. Thus, the battery post terminal 4 of this embodiment includes the reinforcement walls 27 provided at two positions. Moreover, as shown in FIG. 2, the two reinforcement walls 27 are arranged opposed to each other across the axis of symmetry 42 of the isosceles triangle defined by the battery post connecting part 20, the harness connecting part 6, and the connector 14.

As described above, in the battery post terminal 4 of this embodiment, the two boss portions 25 and the two reinforcement walls 27 are arranged in a balanced distribution at proper intervals. Accordingly, even when the torque is applied to the battery post terminal 4, a load is distributed in a proper manner, which further makes the battery post terminal 4 less likely to deform.

As thus far described, the battery state detection device 1 of this embodiment includes the shunt resistor 7 and the battery post terminal 4. The shunt resistor 7 includes the second conductor part 12 having a flat shape. The battery post terminal 4 includes the battery post connecting part 20 for connection to the battery post 3, and the shunt resistor connecting part 22 for connection to the second conductor part 12 of the shunt resistor 7. The shunt resistor connecting part 22 has a flat shape. The second conductor part 12 of the shunt resistor 7 and the shunt resistor connecting part 22 of the battery post terminal 4 are connected to each other by welding.

The battery state detection device 1 of this embodiment is manufactured through the following manufacturing method. The manufacturing method includes a welding step and a casing molding step. In the welding step, the shunt resistor 7 and the battery post terminal 4 are connected to each other by welding. In the casing molding step, the casing 8 is molded while the shunt resistor 7 and the battery post terminal 4 connected to each other by welding are partially inserted.

Since connection between the shunt resistor 7 and the battery post terminal 4 is made by welding, the bolt and nut which have been conventionally used for the connection of them are not required. As a result, the battery state detection device can be downsized as compared with the conventional configuration. Additionally, the connection made by welding is less complicated and can be completed in a shorter time than the operation of tightening the bolt and nut. Accordingly, the configuration of this embodiment can shorten a time required for manufacturing the battery state detection device. Moreover, connecting the shunt resistor 7 and the battery post terminal 4 to each other by welding is enabled as long as they have flat portions. Accordingly, the configuration of this embodiment eliminates the need to provide holes for receiving the bolt in the shunt resistor 7 and the casing 8. Therefore, even when, for example, a change of the shape of the battery post terminal 4 occurs, there is no need to change the designs of the shunt resistor 7 and the casing 8. This makes it possible to dynamically adapt to a variety of types of battery post structures.

Although a preferred embodiment of the present invention has been described above, the above-described configurations can be modified, for example, as follows.

In the above-described embodiment, the battery post terminal 4 and the shunt resistor 7 are inserted during the molding of the casing 8. This, however, is not limiting. It may be acceptable that, after the casing 8 is molded in the conventional manner, the battery post terminal 4 and the shunt resistor 7 welded to each other are assemble to the casing 8. This also can exert the effect of the invention of the present application because of the elimination of the bolt and nut which have been conventionally required.

The shapes of the battery post terminal 4, the shunt resistor 7, the casing 8, and the like, are not limited to the illustrated ones, and may be appropriately changed.

DESCRIPTION OF THE REFERENCE NUMERALS 1 battery state detection device
4 battery post terminal
7 shunt resistor
12 second conductor part (conductor part)
20 battery post connecting part
22 shunt resistor connecting part
25 boss portion
26 bent portion

The invention claimed is:

1. A battery state detection device comprising:
a shunt resistor comprising a conductor part, wherein the conductor part comprises a flat portion; and
a battery post terminal comprising:
a battery post connecting portion facilitating connection to a battery post,
a bent portion providing a degree of structural rigidity facilitating resistance to a torsional force applied to the battery post connecting portion via a wiring harness connecting portion,
a reinforcement wall adjacent to the bent portion, and
a shunt resistor connecting portion that is to be connected, by welding, to the flat portion of the conductor part of the shunt resistor, wherein a first fold line and a second fold line of the bent portion are substantially parallel, wherein the bent portion comprises a first flat portion that extends in a first plane from the battery post connecting portion, wherein the first fold line results in deflecting a transition portion of the bent portion from the first flat portion in the first plane into a second plane that is a different plane than the first plane, wherein the second fold line results in deflecting a second flat portion of the bent portion from the transition portion in the second plane into a third plane of the bent portion that is a different plane than the second plane, wherein the second flat portion comprises the shunt resistor connecting portion, wherein the first plane and the third plane are substantially parallel and offset by an offset distance resulting in the bent portion having an S-shape, wherein a first axis of the first fold line and a second axis of the second fold line are substantially parallel to a longitudinal direction of the shunt resistor, wherein a first distance between a first edge and a second edge of the shunt resistor connecting portion of the battery post terminal is less than a second distance between a third edge and a fourth edge of the bent portion of the battery post terminal, and wherein the first distance and the second distance are measured in the longitudinal direction of the shunt resistor.

2. The battery state detection device according to claim 1, wherein
the shunt resistor includes a harness connecting part that is to be connected to a harness, and the battery post terminal is provided with a boss portion that extends along an imaginary line connecting the battery post connecting part to the harness connecting part.

3. The battery state detection device according to claim 1, wherein
the reinforcement wall provides more structural rigidity facilitating resistance to the torsional force applied to the battery post connecting portion via a wiring harness connecting portion.

4. The battery state detection device according to claim 1, wherein the second flat portion in the third plane comprises the first edge and the third edge, and wherein the first edge and the third edge are substantially perpendicular to the second fold line.

5. The battery state detection device according to claim 1, comprising:
a circuit board that detects a current having flowed through the shunt resistor; and
a casing that houses the circuit board, wherein the casing is molded while the shunt resistor and the battery post terminal, which are connected to each other by the welding, are at least partially inserted in a region to be encased by the casing,
the second flat portion of the battery post terminal comprises an exposure boundary portion having a flat shape, wherein the exposure boundary portion is substantially parallel to the longitudinal direction of the shunt resistor, and wherein the exposure boundary portion is at a boundary between an inserted portion of the battery post terminal inserted in the casing and an exposed portion of the battery post terminal exposed to the outside of the casing.

6. The battery state detection device according to claim 5, wherein
the inserted portion of the battery post terminal and an inserted shunt resistor portion of the shunt resistor that are inserted in the region to be encased by the casing are provided with bevels.

7. The battery state detection device according to claim 1, wherein the shunt resistor connecting portion comprises a substantially flat rectangular shape in the third plane and has a width, a height, and a thickness.

8. The battery state detection device according to claim 7, wherein the thickness is less than the width or the height, and wherein the width is measured between the first edge and the second edge.

9. The battery state detection device according to claim 8, wherein the height is measured between a fifth edge that is substantially parallel to the longitudinal direction of the shunt resistor and an intersection between the shunt resistor connecting portion and a sixth edge of the bent portion.

* * * * *